US011275428B2

(12) United States Patent
Yuan et al.

(10) Patent No.: US 11,275,428 B2
(45) Date of Patent: Mar. 15, 2022

(54) CAPACITANCE DETECTION CIRCUIT, TOUCH CONTROL CHIP AND ELECTRONIC DEVICE

(71) Applicant: SHENZHEN GOODIX TECHNOLOGY CO., LTD., Shenzhen (CN)

(72) Inventors: Guangkai Yuan, Shenzhen (CN); Guopao Li, Shenzhen (CN); Zhi Yao, Shenzhen (CN); Guanliang Liao, Shenzhen (CN)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 17/121,754

(22) Filed: Dec. 15, 2020

(65) Prior Publication Data
US 2021/0200296 A1 Jul. 1, 2021

Related U.S. Application Data

(63) Continuation of application No. PCT/CN2019/128859, filed on Dec. 26, 2019.

(51) Int. Cl.
G06F 1/3234 (2019.01)
G06F 3/044 (2006.01)

(52) U.S. Cl.
CPC .......... *G06F 1/3262* (2013.01); *G06F 3/0443* (2019.05); *G06F 3/0446* (2019.05)

(58) Field of Classification Search
CPC .... G06F 1/3262; G06F 3/0446; G06F 3/0443; G06F 3/04182; H03F 2203/45522;
(Continued)

(56) References Cited

U.S. PATENT DOCUMENTS 8,648,834 B2 2/2014 Wong et al.
2009/0079501 A1* 3/2009 Watai ............... G01D 3/02
330/254
(Continued)

FOREIGN PATENT DOCUMENTS

CN 102789344 A 11/2012
CN 104007884 A 8/2014
(Continued)

*Primary Examiner* — Mark W Regn

(57) ABSTRACT

The present application provides a capacitance detection circuit, which could reduce the influence of screen noise on capacitance detection. The capacitance detection circuit includes: an amplification circuit connected to the capacitor to be detected, and configured to convert a capacitance signal of the capacitor to be detected into a voltage signal, the voltage signal being associated with the capacitance of the capacitor to be detected; and a control circuit connected to the amplification circuit, and configured to control an amplification factor of the amplification circuit to be a first amplification factor in a first period, and to control the amplification factor of the amplification circuit to be a second amplification factor in a second period, where noise generated by the screen in the first period is less than noise generated by the screen in the second period, and the first amplification factor is greater than the second amplification factor.

15 Claims, 2 Drawing Sheets

(58) Field of Classification Search
CPC . H03F 2203/45528; H03F 2203/45534; H03F 3/45475

See application file for complete search history.

(56) References Cited

U.S. PATENT DOCUMENTS

| | | | |
|---|---|---|---|
| 2011/0043279 | A1 | 2/2011 | Adachi |
| 2012/0293444 | A1 | 11/2012 | Wong et al. |
| 2013/0285973 | A1 | 10/2013 | Elias et al. |
| 2014/0240278 | A1* | 8/2014 | Kim .......................... H03F 1/14 345/174 |
| 2016/0301372 | A1* | 10/2016 | Gao ........................ H01L 23/48 |
| 2018/0059870 | A1 | 3/2018 | Krah |

FOREIGN PATENT DOCUMENTS

| | | |
|---|---|---|
| CN | 107466368 A | 12/2017 |
| CN | 105743454 B | 12/2018 |
| JP | 2013003997 A | 1/2013 |

* cited by examiner

CAPACITANCE DETECTION CIRCUIT, TOUCH CONTROL CHIP AND ELECTRONIC DEVICE

CROSS-REFERENCE TO RELATED APPLICATIONS

This application is a continuation of International Application No. PCT/CN2019/128859, filed on Dec. 26, 2019, the disclosure of which is hereby incorporated by reference in its entirety.

TECHNICAL FIELD

Embodiments of the present application relate to the field of capacitance detection, and more particularly, to a capacitance detection circuit, a touch control chip and an electronic device.

BACKGROUND

Capacitive sensors are widely used in electronic products to achieve touch detection. When a conductor such as a finger approaches or touches a detection electrode, a capacitance corresponding to the detection electrode changes. By detecting a variation of the capacitance, information that the finger approaches or touches the detection electrode can be acquired, so as to determine user operation. However, noise generated by a screen of an electronic device would affect the foregoing detection result. Therefore, how to reduce the influence of display screen noise on capacitance detection is an urgent problem to be solved.

SUMMARY

Embodiments of the present application provide a capacitance detection circuit, a touch control chip and an electronic device, which could reduce the influence of screen noise on capacitance detection.

In a first aspect, a capacitance detection circuit is provided, configured to detect a capacitance of a capacitor to be detected, the capacitor to be detected being a capacitor for touch detection in a screen of an electronic device, and the capacitance detection circuit including:

an amplification circuit connected to the capacitor to be detected, and configured to convert a capacitance signal of the capacitor to be detected into a voltage signal, the voltage signal being associated with the capacitance of the capacitor to be detected; and a control circuit connected to the amplification circuit, and configured to control an amplification factor of the amplification circuit to be a first amplification factor in a first period, and to control the amplification factor of the amplification circuit to be a second amplification factor in a second period, where noise generated by the screen in the first period is less than noise generated by the screen in the second period, and the first amplification factor is greater than the second amplification factor.

In a possible implementation manner, the amplification circuit includes an operational amplifier, and a first feedback resistor and a second feedback resistor connected between an input end and an output end of the operational amplifier, a resistance value of the first feedback resistor is greater than a resistance value of the second feedback resistor, and the control circuit is configured to: control, in the first period, the first feedback resistor to be connected and the second feedback resistor to be disconnected, so that the amplification factor of the amplification circuit is the first amplification factor; and control, in the second period, the second feedback resistor to be connected and the first feedback resistor to be disconnected, so that the amplification factor of the amplification circuit is the second amplification factor.

In a possible implementation manner, the operational amplifier is a differential operational amplifier, and one first feedback resistor and one second feedback resistor are connected between a first input end and a first output end of the differential operational amplifier; and one first feedback resistor and one second feedback resistor are connected between a second input end and a second output end of the differential operational amplifier.

In a possible implementation manner, the amplification circuit further includes a switch connected in series to each feedback resistor, and the control circuit controls connection and disconnection of the each feedback resistor through the switch.

In a possible implementation manner, the first period and the second period are determined according to a scanning frequency of the screen.

In a possible implementation manner, the capacitance detection circuit further includes: a driving circuit connected to the capacitor to be detected, and configured to input a driving signal to the capacitor to be detected.

In a possible implementation manner, the capacitance detection circuit further includes: a filter circuit connected to the amplification circuit, and configured to perform filtering processing on the voltage signal output by the amplification circuit.

In a possible implementation manner, the capacitance detection circuit further includes: a sample circuit connected to the filter circuit, and configured to convert the filtered voltage signal into a digital signal.

In a second aspect, a touch control chip is provided, including: the capacitance detection circuit in the foregoing first aspect or any one of possible implementation manners of the first aspect.

In a third aspect, an electronic device is provided, including: a screen; and the touch control chip in the foregoing second aspect or any one of possible implementation manners of the second aspect.

Based on the foregoing technical solutions, a control circuit in a capacitance detection circuit controls an amplification factor of an amplification circuit, so that the amplification circuit has a greater amplification factor in a first period with low screen noise to improve a signal-to-noise ratio (SNR) for capacitance detection, and so that the amplification circuit has a smaller amplification factor in a second period with high screen noise to avoid saturation of the amplification circuit. The capacitance detection circuit improves the signal-to-noise ratio for capacitance detection while ensuring effective operation of the amplification circuit, and has better detection performance.

DESCRIPTION OF EMBODIMENTS

Technical solutions in the present application will be described hereinafter with reference to the accompanying drawings.

For a screen of an electronic device, especially a Y-OCTA screen, a display layer of the screen generates greater noise in scanning, and the noise would affect a touch control layer and easily saturates an amplification circuit in a capacitance detection circuit of the touch control layer. If saturation is avoided by reducing an amplification factor of the amplification circuit, an effective detecting signal is also affected, thereby reducing performance of the capacitance detection circuit.

The present application provides a capacitance detection circuit, which could reduce the influence of screen noise on capacitance detection.

Figure 1:
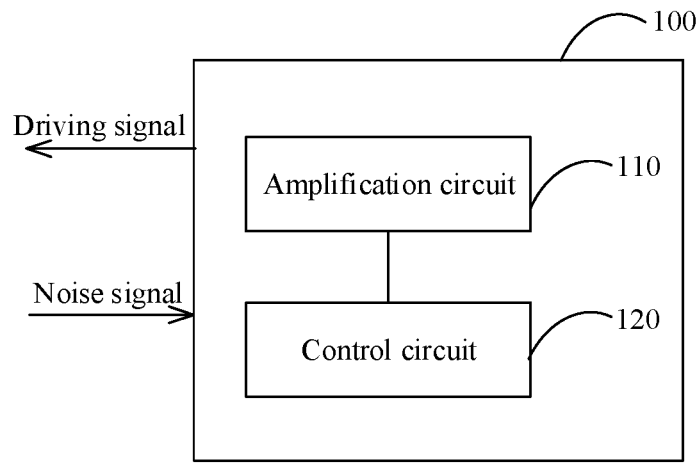
FIG. 1 is a schematic block diagram of a capacitance detection circuit according to an embodiment of the present application.

FIG. 1 is a schematic block diagram of a capacitance detection circuit according to an embodiment of the present application. The capacitance detection circuit 100 is configured to detect a capacitance of a capacitor to be detected Cx, and the capacitor to be detected Cx is a capacitor for touch detection in a screen of an electronic device. As shown in FIG. 1, the capacitance detection circuit 100 includes an amplification circuit 110 and a control circuit 120.

The amplification circuit 110 is connected to the capacitor to be detected Cx, and configured to convert a capacitance signal of the capacitor to be detected Cx into a voltage signal, and the voltage signal is associated with the capacitance of the capacitor to be detected Cx.

The control circuit 120 is connected to the amplification circuit 110, and configured to control an amplification factor of the amplification circuit 110 to be a first amplification factor in a first period T1, and to control the amplification factor of the amplification circuit 110 to be a second amplification factor in a second period T2.

Noise generated by the screen in the first period T1 is less than noise generated by the screen in the second period T2, and the first amplification factor is greater than the second amplification factor.

Figure 4:
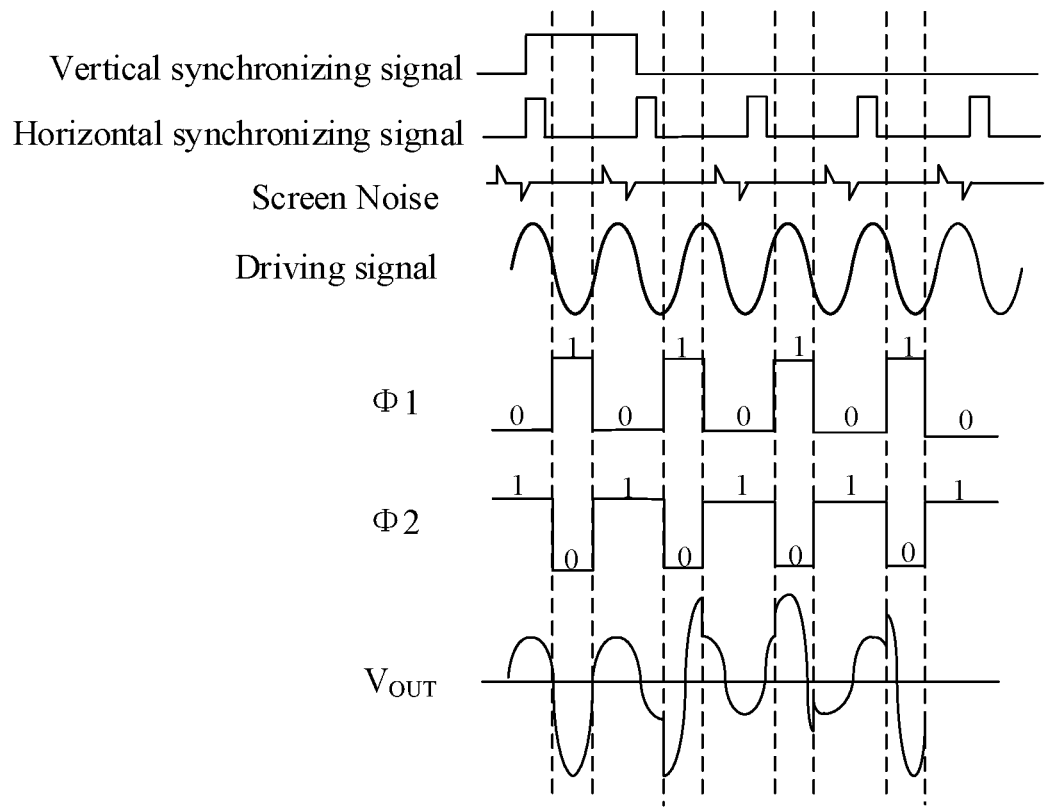
FIG. 4 is a schematic diagram of an operation timing based on the amplification circuit shown in FIG. 3.

When the screen is scanning, there is a relationship between a scanning signal and noise generated by the screen. FIG. 4 shows a vertical synchronizing signal (Vsync) and a horizontal synchronizing signal (Hsync) of the screen. The horizontal synchronizing signal changes in accordance with a certain rule. As can be seen from FIG. 4, a phase difference between noise of the screen and the horizontal synchronizing signal is basically constant, and the noise of the screen also changes in accordance with a certain rule. Based on this, the noise generated by the screen may be divided into a first period T1 and a second period T2 in time, the first period T1 is a low noise period, and the second period T2 is a high noise period.

How to determine the first period T1 and the second period T2 is not limited in the embodiment of the present application. For example, the screen noise may be detected directly, and the first period T1 and the second period T2 are determined according to a change of the detected noise; or by analyzing an output signal of the capacitance detection circuit 100, the first period T1 and the second period T2 are determined according to quality of the output signal.

The amplification circuit 110 may amplify and output a signal. In this embodiment, an input end of the amplification circuit 110 is connected to the capacitor to be detected Cx, and an output end of the amplification circuit 110 outputs a voltage signal. The voltage signal is associated with the capacitance of the capacitor to be detected Cx. When the capacitance of the capacitor to be detected Cx changes, the voltage signal output by the amplification signal also changes. Therefore, a change of the capacitance of the capacitor to be detected Cx may be determined through the voltage signal output by the amplification circuit 110. That is, the amplification circuit 110 may convert a capacitance signal of the capacitor to be detected Cx into a voltage signal to achieve detection of the capacitor to be detected Cx.

The control circuit 120 is configured to control the amplification factor of the amplification circuit 110. The amplification circuit 110 has a greater amplification factor in the first period T1 to improve an SNR for capacitance detection; and the amplification circuit 110 has a smaller amplification factor in the second period T2 to avoid saturation of the amplification circuit 110 and to ensure effective operation of the amplification circuit 110. Therefore, the capacitance detection circuit 110 improves the signal-to-noise ratio for capacitance detection while ensuring the effective operation of the amplification circuit 110, and has better detection performance.

The capacitance detection circuit in the embodiment of the present application may be used for mutual capacitance detection or self-capacitance detection, and the capacitor to be detected Cx may be a self-capacitance of each electrode to ground. Alternatively, the capacitor to be detected Cx is a mutual capacitance between a driving electrode and a detection electrode. The driving electrode is configured to input a driving signal, denoted as TX. The detection electrode may also be referred to as a sensing electrode, which is configured to sense the driving signal and generate a detecting signal, denoted as RX. The following is described merely by an example of mutual capacitance detection.

In this embodiment, the amplification factor of the amplification circuit 110 may be adjusted through a feedback resistor.

For example, the amplification circuit 110 includes: an operational amplifier, and a first feedback resistor and a second feedback resistor connected between an input end and an output end of the operational amplifier. A resistance value of the first feedback resistor is greater than a resistance value of the second feedback resistor.

In this case, the control circuit 120 may: control the first feedback resistor to be connected and the second feedback resistor to be disconnected in the first period, so that the amplification factor of the amplification circuit 110 is the first amplification factor; and control the second feedback resistor to be connected and the first feedback resistor to be disconnected in the second period, so that the amplification factor of the amplification circuit 110 is the second amplification factor.

The control circuit 120 may, for example, control connection or disconnection of the first feedback resistor and the second feedback resistor through switches.

When a user performs a touch operation on the screen, a capacitance value of a capacitor to be detected Cx at a corresponding position changes. A capacitance signal of the capacitor to be detected Cx is converted into a voltage signal by the amplification circuit 110, and the voltage signal may reflect a change of a capacitance of the capacitor to be detection Cx, thereby acquiring touch information of the user. In a detection process of the capacitor to be detected Cx, the amplification factor of the amplification circuit 110 may be adjusted by using different feedback resistors respectively in different periods, thereby reducing the influence of the screen noise on capacitance detection as much as possible.

Figure 2:
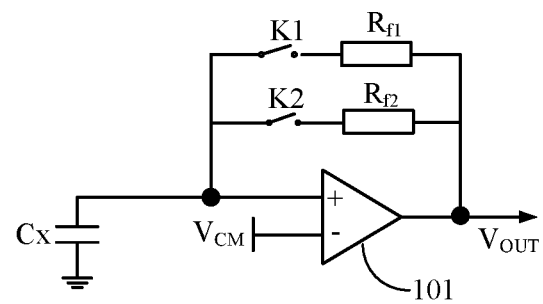
FIG. 2 is a possible schematic structural diagram of an amplification circuit according to an embodiment of the present application.

For example, as shown in FIG. 2, the amplification circuit 110 includes an operational amplifier 101, a feedback resistor $R_{f1}$ and a feedback resistor $R_{f2}$. A switch K1 and the feedback resistor $R_{f1}$ are connected in series between one input end and an output end of the operational amplifier 101, a switch K2 and the feedback resistor $R_{f2}$ are connected in series between the input end and the output end of the operational amplifier 101, the input end is connected to one end of the capacitor to be detected Cx, and the other end of the capacitor to be detected Cx is grounded. The other input end of the operational amplifier 101 is connected to a voltage $V_{CM}$. A resistance value of the feedback resistor $R_{f1}$ is greater than a resistance value of the feedback resistor $R_{f2}$. The control circuit 120 may: control the switch K1 to be turned on and the switch K2 to be turned off in the first period T1, so that the amplification circuit 110 has a greater amplification factor; and control the switch K2 to be turned on and the switch K1 to be turned off in the second period T2, so that the amplification circuit 110 has a smaller amplification factor.

In the embodiment of the present application, the operational amplifier in the amplification circuit 110 may be a differential operational amplifier. In this case, one first feedback resistor and one second feedback resistor are connected between a first input end and a first output end of the differential operational amplifier, and one first feedback resistor and one second feedback resistor are connected between a second input end and a second output end of the differential operational amplifier.

The amplification circuit 110 may further include a switch connected in series to each feedback resistor, and the control circuit 120 controls connection and disconnection of the each feedback resistor through the switch.

Figure 3:
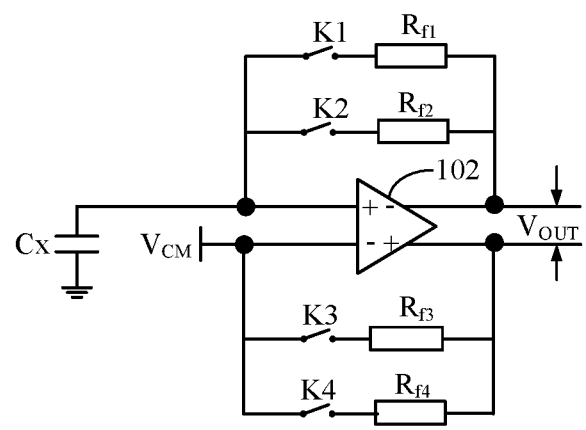
FIG. 3 is a possible schematic structural diagram of an amplification circuit according to an embodiment of the present application.

For example, as shown in FIG. 3, the amplification circuit 110 includes a differential operational amplifier 102, a feedback resistor $R_{f1}$ and a feedback resistor $R_{f2}$, and a feedback resistor $R_{f3}$ and a feedback resistor $R_{f4}$. A switch K1 and the feedback resistor $R_{f1}$ are connected in series between a first input end and a first output end of the differential operational amplifier 102, a switch K2 and the feedback resistor $R_{f2}$ are connected in series between the first input end and the first output end of the differential operational amplifier 102, a switch K3 and the feedback resistor $R_{f3}$ are connected in series between a second input end and a second output end of the differential operational amplifier 102, and a switch K4 and the feedback resistor $R_{f4}$ are connected in series between the second input end and the second output end of the differential operational amplifier 102. One end of the capacitor to be detected Cx is connected to the first input end of the differential operational amplifier 102, and the other end of the capacitor to be detected Cx is grounded. The second input end of the differential operational amplifier 102 is connected to a voltage $V_{CM}$. The first input end, the second input end, the first output end and the second output end are not limited here, and the description is made by an example that the first input end is a positive input end, the second input end is a negative input end, the first output end is a negative output end and the second output end is a positive output end.

$R_{f1} > R_{f2}$, and $R_{f4} > R_{f3}$. Preferably, $R_{f1} = R_{f4}$, and $R_{f2} = R_{f3}$.

In the first period T1, the control circuit 120 controls the switch K1 and the switch K4 to be turned on, and the switch K2 and the switch K3 to be turned off, that is, $\Phi 1=1$, and $\Phi 2=0$, and $\Phi 1$ and $\Phi 2$ are control signals. At this time, the resistors $R_{f1}$ and $R_{f4}$ are connected. The amplification circuit 110 has a greater amplification factor, such as $V_{OUT}$ shown in FIG. 4.

In the second period T2, the control circuit 120 controls the switch K2 and the switch K3 to be turned on, and the switch K1 and the switch K4 to be turned off, that is, $\Phi 1=0$, and $\Phi 2=1$. At this time, the resistors $R_{f2}$ and $R_{f3}$ are connected. The amplification circuit 110 has a smaller amplification factor, such as $V_{OUT}$ shown in FIG. 4.

The differential operational amplifier 102 may convert a capacitance signal of the capacitor to be detected Cx into a voltage signal $V_{OUT}$. In FIG. 3, an output signal $V_{OUT}$ of the differential operational amplifier 102 is a differential signal. Compared with the amplifier 101 shown in FIG. 2, the output signal $V_{OUT}$ of the differential operational amplifier 102 has a higher signal-to-noise ratio.

In the embodiment of the present application, a feedback capacitor connected in parallel to the feedback resistors may be disposed between the input end and the output end of the operational amplifier.

Optionally, the capacitance detection circuit 100 further includes: a driving circuit 130 connected to the capacitor to be detected Cx, and configured to input a driving signal to the capacitor to be detected Cx.

Optionally, the capacitance detection circuit 100 further includes: a filter circuit 140 connected to the amplification circuit 110, and configured to perform filtering processing on the voltage signal output by the amplification circuit 110.

Optionally, the capacitance detection circuit 110 further includes: a sample circuit 150 connected to the filter circuit 140, and configured to convert the filtered voltage signal into a digital signal.

Figure 5:
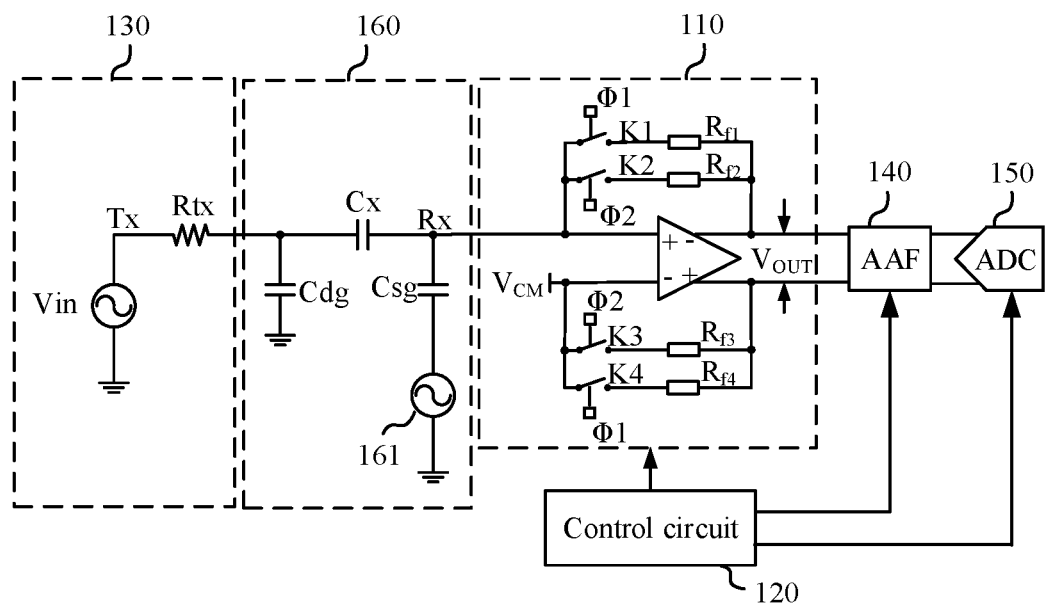
FIG. 5 is a possible implementation manner based on the circuit shown in FIG. 1.

FIG. 5 shows a possible implementation manner based on the circuit shown in FIG. 1. A capacitance detection circuit in FIG. 5 includes a driving circuit 130, an amplification circuit 110, a control circuit 120, a filter circuit 140 and a sample circuit 150. A screen body mutual capacitance model 160 in FIG. 5 is an equivalent diagram of a touch control model in a screen, where Csg is an equivalent capacitance of a detection electrode (RX) in the screen, Cdg is an equivalent capacitance of a driving electrode (TX) in the screen, a capacitor to be detected Cx is an equivalent capacitance between RX and TX, and 161 is a noise signal source in the screen body. One end of the capacitor to be detected Cx is connected to the system ground, and the other end is connected to the amplification circuit 110. When there is a touch operation on the capacitor to be detected Cx, its capacitance relative to the system ground increases. The capacitance detection circuit detects a change of the capacitance of the capacitor to be detected Cx, and then may acquire touch information of a user.

The driving circuit 130 is configured to generate a driving signal. After the driving signal is input to the driving electrode TX, a sensing electrode TX at a corresponding position senses the driving signal and generates a detecting signal. The detecting signal may be, for example, a voltage signal. A capacitance signal of the capacitor to be detected Cx may be converted into the voltage signal by the amplification circuit 110. The filter circuit 140 may be, for example, an analog antialiasing filter (AAF) having a low-pass characteristic to avoid aliasing of a high frequency signal or noise into the sample circuit 150. The sample circuit 150 is, for example, an analog-to-digital converter (ADC) circuit, and configured to convert the voltage signal into a digital signal to facilitate processing of the digital signal by a digital system. The control circuit 120 may control states of switches K1 to K4 so that the amplification circuit has a greater amplification factor in a first period T1 and has a smaller amplification factor in a second period T2. In addition, the control circuit may further control other parts of the capacitance detection circuit, such as a cut-off frequency of the filter circuit 140.

It can be seen that the control circuit 120 controls the amplification factor of the amplification circuit 110, so that the amplification circuit 110 has a greater amplification factor in the first period T1 with low screen noise to improve an SNR for capacitance detection, and so that the amplification circuit has a smaller amplification factor in the second period T2 with high screen noise to avoid saturation of an amplifier in the amplification circuit 110. Thus, the signal-to-noise ratio for capacitance detection is improved, while effective operation of the amplification circuit 110 is ensured, so that the capacitance detection circuit has better detection performance.

An embodiment of the present application further provides a touch control chip, including the capacitance detection circuit in the foregoing various embodiments of the present application.

An embodiment of the present application further provides an electronic device, and the electronic device includes: a screen; and the touch control chip in the foregoing various embodiments of the present application.

By way of example and not limitation, the electronic device in the embodiment of the present application may be portable or mobile computing devices such as a terminal device, a mobile phone, a tablet computer, a notebook computer, a desktop computer, a gaming device, an in-vehicle electronic device or a wearable smart device, and other electronic devices such as an electronic database, an automobile and an automated teller machine (ATM). The wearable smart device includes a smart watch, smart glasses or the like that is full-featured, large-sized, and can realize complete or partial functions without relying on a smart phone, and various types of smart wristbands, smart jewelry and other devices for physical signs monitoring that only focus on a certain type of application function, and need to be used in cooperation with other devices such as a smart phone.

It should be noted that, under a premise of no conflict, various embodiments and/or technical features in the various embodiments described in the present application may be combined with each other arbitrarily, and the technical solutions obtained after the combination should also fall within the protection scope of the present application.

It should be understood that specific examples in the embodiments of the present application are just for helping those skilled in the art better understand the embodiments of the present application, rather than for limiting the scope of the embodiments of the present application. Those skilled in the art can make various improvements and variations on the basis of the foregoing embodiments, and such improvements or variations are all within the protection scope of the present application.

The foregoing descriptions are merely specific embodiments of the present application, but the protection scope of the present application is not limited thereto, those skilled in the art who are familiar with the art could readily think of variations or substitutions within the technical scope disclosed by the present application, and these variations or substitutions shall fall within the protection scope of the present application. Therefore, the protection scope of the present application shall be subject to the protection scope of the claims.

What is claimed is:

1. A capacitance detection circuit, configured to detect a capacitance of a capacitor to be detected, the capacitor to be detected being a capacitor for touch detection in a touch control layer of an electronic device, and the capacitance detection circuit comprising:
   an amplification circuit, connected to the capacitor to be detected and configured to convert a capacitance signal of the capacitor to be detected into a voltage signal, the voltage signal being associated with the capacitance of the capacitor to be detected; and
   a control circuit, connected to the amplification circuit and configured to control an amplification factor of the amplification circuit to be a first amplification factor in a first period, and to control the amplification factor of the amplification circuit to be a second amplification factor in a second period,
   wherein noise generated by a display layer of the electronic device in the first period is less than noise generated by the display layer in the second period, and the first amplification factor is greater than the second amplification factor to improve a signal-to-noise ratio of capacitance detection circuit in the first period and avoid saturation of the amplification circuit in the second period;
   wherein the first period and the second period are determined according to a scanning frequency of the display layer.

2. The capacitance detection circuit according to claim 1, wherein the amplification circuit comprises an operational amplifier, and a first feedback resistor and a second feedback resistor connected between an input end and an output end of the operational amplifier, a resistance value of the first feedback resistor is greater than a resistance value of the second feedback resistor, and the control circuit is configured to:
   control, in the first period, the first feedback resistor to be connected and the second feedback resistor to be disconnected, so that the amplification factor of the amplification circuit is the first amplification factor; and
   control, in the second period, the second feedback resistor to be connected and the first feedback resistor to be disconnected, so that the amplification factor of the amplification circuit is the second amplification factor.

3. The capacitance detection circuit according to claim 2, wherein the operational amplifier is a differential operational amplifier, and
   one first feedback resistor and one second feedback resistor are connected between a first input end and a first output end of the differential operational amplifier; and
   one first feedback resistor and one second feedback resistor are connected between a second input end and a second output end of the differential operational amplifier.

4. The capacitance detection circuit according to claim 2, wherein the amplification circuit further comprises a switch connected in series to each feedback resistor, and the control circuit controls connection and disconnection of the each feedback resistor through the switch.

5. The capacitance detection circuit according to claim 1, wherein the capacitance detection circuit further comprises:

a driving circuit connected to the capacitor to be detected, and configured to input a driving signal to the capacitor to be detected.

6. The capacitance detection circuit according to claim 1, wherein the capacitance detection circuit further comprises:
a filter circuit connected to the amplification circuit, and configured to perform filtering processing on the voltage signal output by the amplification circuit.

7. The capacitance detection circuit according to claim 6, wherein the capacitance detection circuit further comprises:
a sample circuit connected to the filter circuit, and configured to convert the filtered voltage signal into a digital signal.

8. A touch control chip, comprising a capacitance detection circuit, wherein the capacitance detection circuit is configured to detect a capacitance of a capacitor to be detected, the capacitor to be detected being a capacitor for touch detection in a touch control layer of an electronic device, and the capacitance detection circuit comprises:
an amplification circuit connected to the capacitor to be detected, and configured to convert a capacitance signal of the capacitor to be detected into a voltage signal, the voltage signal being associated with the capacitance of the capacitor to be detected; and
a control circuit connected to the amplification circuit, and configured to control an amplification factor of the amplification circuit to be a first amplification factor in a first period, and to control the amplification factor of the amplification circuit to be a second amplification factor in a second period, wherein noise generated by a display layer of the electronic device in the first period is less than noise generated by the display layer in the second period, and the first amplification factor is greater than the second amplification factor to improve a signal-to-noise ratio of capacitance detection circuit in the first period and avoid saturation of the amplification circuit in the second period;
wherein the first period and the second period are determined according to a scanning frequency of the display layer.

9. The touch control chip according to claim 8, wherein the amplification circuit comprises an operational amplifier, and a first feedback resistor and a second feedback resistor connected between an input end and an output end of the operational amplifier, a resistance value of the first feedback resistor is greater than a resistance value of the second feedback resistor, and the control circuit is configured to:
control, in the first period, the first feedback resistor to be connected and the second feedback resistor to be disconnected, so that the amplification factor of the amplification circuit is the first amplification factor; and
control, in the second period, the second feedback resistor to be connected and the first feedback resistor to be disconnected, so that the amplification factor of the amplification circuit is the second amplification factor.

10. The touch control chip according to claim 9, wherein the operational amplifier is a differential operational amplifier, and
one first feedback resistor and one second feedback resistor are connected between a first input end and a first output end of the differential operational amplifier; and
one first feedback resistor and one second feedback resistor are connected between a second input end and a second output end of the differential operational amplifier.

11. The touch control chip according to claim 9, wherein the amplification circuit further comprises a switch connected in series to each feedback resistor, and the control circuit controls connection and disconnection of the each feedback resistor through the switch.

12. The touch control chip according to claim 8, wherein the capacitance detection circuit further comprises:
a driving circuit connected to the capacitor to be detected, and configured to input a driving signal to the capacitor to be detected.

13. The touch control chip according to claim 8, wherein the capacitance detection circuit further comprises:
a filter circuit connected to the amplification circuit, and configured to perform filtering processing on the voltage signal output by the amplification circuit.

14. The touch control chip according to claim 13, wherein the capacitance detection circuit further comprises:
a sample circuit connected to the filter circuit, and configured to convert the filtered voltage signal into a digital signal.

15. An electronic device, comprising:
a screen; and
the touch control chip according to claim 8.

* * * * *